United States Patent [19]

Harui et al.

[11] Patent Number: 5,255,280
[45] Date of Patent: Oct. 19, 1993

[54] SEMICONDUCTOR LASER

[75] Inventors: Hironobu Harui; Shoji Hirata, both of Kanagawa, Japan

[73] Assignee: Sony Corporation, Tokyo, Japan

[21] Appl. No.: 872,126

[22] Filed: Apr. 22, 1992

[30] Foreign Application Priority Data

Apr. 22, 1991 [JP] Japan .................................. 3-090816
Apr. 25, 1991 [JP] Japan .................................. 3-095344

[51] Int. Cl.$^5$ ................................................ H01S 3/19
[52] U.S. Cl. ........................................ 372/46; 372/45; 372/48
[58] Field of Search ............................. 372/46, 45, 48

[56] References Cited

U.S. PATENT DOCUMENTS 5,111,469 5/1992 Narui et al. ......................... 372/46

FOREIGN PATENT DOCUMENTS 0293687 11/1989 Japan ................................ 372/46
4-024977 1/1992 Japan ................................ 372/46
4-079282 3/1992 Japan ................................ 372/46

Primary Examiner—Georgia Y. Epps
Attorney, Agent, or Firm—Hill, Steadman & Simpson

[57] ABSTRACT

A semiconductor laser has a substrate having a strip raised region on a principal surface thereof which comprises a {100} face, the strip raised region extending along a <011> axis. First lower and second upper cladding layers are disposed on the substrate, and an active layer is interposed between the first and second cladding layers. The first and second cladding layers and the active layers are divided into sections in a cross-sectionally triangular body and sections on opposite sides of the cross-sectionally triangular body, by two slant surfaces extending from opposite edges of the raised region and intersecting with each other above the raised region. The semiconductor laser also includes a current blocking layer disposed on each side of the cross-sectionally triangular body, a third cladding layer covering the current blocking layer and the cross-sectionally triangular body, and a cap layer disposed on the third cladding layer. A supplied current flows substantially through the active layer in the cross-sectionally triangular body, enabling the active layer to emit light.

15 Claims, 7 Drawing Sheets

SEMICONDUCTOR LASER

BACKGROUND OF THE INVENTION

1. Field of the Invention

The present invention relates to a semiconductor laser, and more particularly to a semiconductor laser having an active layer for constricting a current in the transverse direction of a cross-sectionally triangular body to reduce a threshold current, and a distributed feedback semiconductor laser of the above structure which is capable of single-mode oscillation.

2. Description of the Prior Art

SDH (Separated Double Hetero Junction) semiconductor lasers having low threshold currents Ith that can be fabricated in one epitaxial growth cycle have been proposed by the applicant as disclosed in Japanese laid-open patent publications Nos. 61-183987 and 2-174287, for example.

One such proposed SDH semiconductor laser is shown in FIG. 1 of the accompanying drawings. As shown in FIG. 1, an N-type substrate 1 made of GaAs, for example, has a principal surface as the {100} plane defined according to Miller indices. The substrate 1 is of a mesa structure having, on the principal surface, a stripe raised region or land 2 extending in the direction of the <011> axis normal to the sheet of FIG. 1. On the principal surface of the substrate 1, there are successively deposited, for example, an N-type buffer layer 13, a first N-type cladding layer 4, an active layer 5 which is of a low impurity concentration or is undoped, a second P-type cladding layer 6, an N-type current blocking layer 8, a third P-type cladding layer 9, and a P-type cap layer 10. These semiconductor layers are deposited in one epitaxial growth cycle according to the ordinary MOCVD (Metal Organic Chemical Vapor Deposition) process, i.e., the methyl MOCVD process.

The first, second, and third cladding layers 4, 6, 9 and the current blocking layer 8 are made of a material having a large band gap, i.e., a small refractive index, compared with the material of the active layer 5.

The crystal orientations of the substrate 1 and the strip raised region 2, the width of the raised region 2, the height of the raised region 2, i.e., the depth of grooves 2A on opposite sides of the raised region 2, and the thicknesses of the first cladding layer 4, the active layer 5, and the second cladding layer 6, are selected such that the first cladding layer 4, the active layer 5, and the second cladding layer 6 on the raised region 2 are separated from the layers over the grooves 2A by slant surfaces 7. The first cladding layer 4, the active layer 5, and the second cladding layer 6 on the raised region 2 jointly make up a cross-sectionally triangular stripe body 20 composed of epitaxial growth layers.

The cross-sectionally triangular stripe body 20 is formed because according to the ordinary MOVCD process that employs a gas of methyl organic metal, once the (111) B face is formed, epitaxial growth layers tend to develop at a reduced rate with respect to the (111) face. The current block layer 8 is divided by the cross-sectionally triangular stripe body 20 into two layer sections one on each side of the body 20. The divided layer sections of the current block layer 8 have opposite ends held against respective opposite ends of the active layer 5 in the body 20 which face the respective slant surfaces 7.

The active layer 5 in the body 20 on the raised region 2 is therefore sandwiched between the divided layer sections of the current blocking layer 8 whose refractive index is smaller than that of the active layer 5. The active layer 5 is therefore confined as a lasing region in the transverse direction of the cross-sectionally triangular body 20. Because the current blocking layer 8 is present, the third cladding layer 9, the current blocking layer 8, the second cladding layer 6, and the first cladding layer 4 jointly provide a P-N-P-N thyristor structure on each side of the cross-sectionally triangular body 20, for blocking a current through those layers. Accordingly, a current is concentrated on the active layer 5 in the body 20 on the raised region 2 for thereby reducing the threshold current.

The divided layer sections of the current block layer 8 have opposite ends held against and covering the respective opposite ends of the active layer 5 in the body 20 which are positioned at the respective slant surfaces 7. With such a layer configuration, some leak currents tend to flow through current paths, indicated by the arrows $i_1$, that extend from the third cladding layer 9 through the N-type current blocking layer 8, the first N-type cladding layer 4, and the N-type buffer layer 13 on the raised region 2 to the N-type substrate 1.

To eliminate such current paths, there has been proposed another semiconductor laser as shown in FIG. 2 of the accompanying drawings. Those parts shown in FIG. 2 which correspond to those shown in FIG. 1 are denoted by identical reference characters, and will not be described in detail. In FIG. 2, the divided layer sections of the current block layer 8 have opposite ends held against respective opposite ends of the second P-type cladding layer 6 in the body 20 which face the respective slant surfaces 7. Therefore, the current block layer 8 does not cover the respective opposite ends of the active layer 5 in the body, and does not contact opposite sides of the first N-type cladding layer 4 which face the respective slant surfaces 7. With the structure shown in FIG. 2, inasmuch as no current paths $i_1$ are produced, the leak currents are reduced.

In FIG. 2, current paths indicated by the arrows $i_2$ extend from the third P-type cladding layer 9 through the second P-type cladding layer 6 in the body 20, the second P-type cladding layer 6 over the grooves 2A, and the N-type buffer layer 13 in the body 20 to the N-type substrate 1. However, since the lower surface of the current blocking layer 8 which is held in contact with the slant surfaces 7 is positioned closely to the upper surface of the active layer 5 in the body 20, the current paths defined between the lower surface of the current blocking layer 8 and the upper surface of the active layer 5 are very narrow, and any leak currents flowing through the current paths are small.

In the case where the active layer 5 is made of AlGaAs, leak currents described below will pose a problem. More specifically, current paths exist which extend from the second P-type cladding layer 6 to the upper surface of the raised region 2, i.e., to the N-type buffer layer 13, as indicated by the arrows $i_2$, or to the N-type substrate 1. Since the built-in potential across the P-N junction in the current paths is lower than the built-in potential between the second cladding layer 6 and the active layer 5 on the raised region 2, leak currents flowing from the second P-type cladding layer 6 over the grooves 2A to the substrate 1 or the buffer layer 13 become dominant. As a result, the current is not sufficiently constricted by the active layer 5 in the transverse direction of the body 20, making it difficult to reduce the threshold level for the operating current.

Distributed feedback (DFB) semiconductor lasers are known as semiconductor lasers capable of single-wavelength oscillation. The DFB semiconductor lasers have a diffraction grating disposed near an active layer for oscillated emission with wavelength selective capability, i.e., lasing in a particular wavelength or a single longitudinal mode. Research and development efforts are being made to apply DFB semiconductor lasers to the wide-band transmission of optical signals over optical fibers.

Generally, when DFB semiconductor lasers are fabricated, the process of depositing semiconductor layers by way of epitaxial growth is interrupted by an etching process for forming the diffraction grating.

DFB semiconductor lasers are also of a structure for a low threshold current. When a strip active layer is embedded as a lasing region, the epitaxial growth process is interrupted and divided into two processes before and after an etching process for forming grooves, because of the embedded structure of the strip active layer, i.e., the structure for optical and carrier confinement.

Where interfaces divided by the two epitaxial growth processes are present in the vicinity of the active layer, the previously formed interface tends to be oxidized between the two epitaxial growth processes, resulting in a characteristic degradation.

SDH semiconductor lasers suffer another problem with respect to efforts to reduce the threshold current.

FIG. 3 of the accompanying drawings shows another conventional semiconductor laser. Those parts shown in FIG. 3 which correspond to those shown in FIG. 1 are denoted by identical reference characters, and will not be described in detail. In FIG. 3, the current blocking layer 8 grows along the {311} B plane, i.e., the (311) B face, in the vicinity of the cross-sectionally triangular body 20, and along the {100} plane, e.g., the (100) face, remotely from the raised region 2. Therefore, regions that grow along a crystal face of higher order, i.e., crystal face regions 23 of higher order indicated by the broken line a, are developed between (311) B face regions 21 and (100) face regions 22.

In such a structure, it is necessary to reduce the thickness of the current block layer 8 so that it does not cover the second P-type cladding layer 6 over the raised region 2. If the width of the active layer 5 is reduced for a lower threshold current, then since the crest of the body 20 which is composed of the second cladding layer 6 is also reduced in size, the current block layer 8 should be further reduced in thickness.

The (311) B face region 21 tends to turn into an N-type region, and the crystal face region 23 where the (311) B face regions 21 progressively change to the (100) B face regions 22 tend to turn into a P-type region. Consequently, if the thickness of the current blocking layer 8 is 3000Å or smaller, then a portion of the current blocking layer 8 turns into a P-type region in each of the crystal face region 23, or a substantially N-type region has a thickness of 1000Å or smaller, producing a tunnel current. When leak currents are produced in the vicinity of the crystal face regions 23 of the current blocking layer 8, these leak currents flowing near the crystal face regions 23 become dominant, with a resultant less current flowing to the active layer 5. Accordingly, the P-N-P-N thyristor structure, referred to above, is virtually impaired, and the threshold current is increased.

One solution is to increase the concentration of the N-type impurity in the current blocking layer 8 to prevent the crystal face regions 23 from turning into P-type regions. However, such an attempt is apt to increase the thickness of the (311) face regions 21. It is thus necessary to control the (311) B face regions 21 such that they will not cover the second P-type cladding layer 6 over the raised region 2. As a consequence, the positions of the semiconductor layers cannot be selected with much leeway, resulting in a reliability problem of the semiconductor lasers.

OBJECTS AND SUMMARY OF THE INVENTION

It is an object of the present invention to provide a semiconductor laser which produces reduced leak currents for a lower threshold current.

Another object of the present invention is to provide a semiconductor laser which has a lower threshold current and is capable of single-wavelength oscillation.

According to the present invention, there is provided a semiconductor laser comprising a semiconductor substrate having a stripe raised region on a principal surface thereof, the raised region having an AlGaAs layer on an uppermost portion thereof, first lower and second upper cladding layers disposed on the semiconductor substrate, an active layer interposed between the first and second cladding layers, the first and second cladding layers and the active layers being divided into sections in a cross-sectionally triangular body and sections on opposite sides of the cross-sectionally triangular body, by two slant surfaces extending from opposite edges of the raised region and intersecting with each other above the raised region, a current blocking layer disposed on each side of the cross-sectionally triangular body, a third cladding layer covering the current blocking layer and the cross-sectionally triangular body, and a cap layer disposed on the third cladding layer, the arrangement being such that a supplied current flows substantially through the active layer in the cross-sectionally triangular body, enabling the active layer to emit light.

The semiconductor laser may further includes a diffraction grating disposed on an upper surface of the AlGaAs layer.

The principal surface of the semiconductor substrate comprises a {100} face, the stripe raised region extending along a <011> axis. The two slant surfaces comprise a {111} B face.

The semiconductor substrate is made of GaAs, and the first and second cladding layers are made of AlGaAs, the AlGaAs layer on the uppermost portion of the raised region contains an amount of Al which is at least equal to the amount of Al contained in the first and second cladding layers. The built-in potential between the AlGaAs layer and the second cladding layer is increased to suppress leak currents therebetween.

More specifically, the built-in potential between the AlGaAs layer and the second cladding layer is larger than the built-in potential between the second cladding layer over the raised region and the active layer. A current flowing through the active layer becomes dominant, thus reducing leak currents. Therefore, a current is sufficiently concentrated on the active layer to reduce leak currents for a lower threshold current. The diffraction grating enables the semiconductor laser to carry out single-wavelength oscillation by way of distributed feedback.

According to the present invention, there is also provided a semiconductor laser comprising a P-type semiconductor substrate having a principal surface comprising as a predetermined crystal face, the semiconductor substrate having a strip raised region on the principal surface, first lower and second upper cladding layers disposed on the semiconductor substrate, an active layer interposed between the first and second cladding layers, the first and second cladding layers and the active layers being divided into sections in a cross-sectionally triangular body and sections on opposite sides of the cross-sectionally triangular body, by two slant surfaces extending from opposite edges of the raised region and intersecting with each other above the raised region, a P-type current blocking layer disposed on each side of the cross-sectionally triangular body, the P-type current blocking layer comprising a relatively thin crystal face region near the cross-sectionally triangular body, the relatively thin crystal face region having a crystal face different from that of the principal surface, a relatively thin crystal face region extending along the principal surface, and a relatively thick region interconnecting both of the relatively thin crystal face regions, a third cladding layer covering the current blocking layer and the cross-sectionally triangular body, and a cap layer disposed on the third cladding layer, the arrangement being such that a supplied current flows substantially through the active layer in the cross-sectionally triangular body, enabling the active layer to emit light.

According to the present invention, there is further provided a semiconductor laser comprising a P-type semiconductor substrate having a principal surface comprising as a predetermined crystal face, the semiconductor substrate having a strip raised region on the principal surface, first lower and second upper cladding layers disposed on the semiconductor substrate, an active layer interposed between the first and second cladding layers, the first and second cladding layers and the active layers being divided into sections in a cross-sectionally triangular body and sections on opposite sides of the cross-sectionally triangular body, by two slant surfaces extending from opposite edges of the raised region and intersecting with each other above the raised region, a current blocking layer disposed on each side of the cross-sectionally triangular body, the current blocking layer comprising a crystal face region near the cross-sectionally triangular body, the crystal face region having a crystal face different from that of the principal surface, a crystal face region extending along the principal surface and composed of a plurality of thin layers of alternately different conductivity types, and a relatively thick P-type single-layer region interconnecting both of the crystal face regions, a third cladding layer covering the current blocking layer and the cross-sectionally triangular body, and a cap layer disposed on the third cladding layer, the arrangement being such that a supplied current flows substantially through the active layer in the cross-sectionally triangular body, enabling the active layer to emit light.

The principal surface of the semiconductor substrate comprises a {100} face. The crystal face region having a crystal face different from that of the principal surface comprises a {311} B face, the crystal face region extending along the principal surface comprises a {100} face, and the relatively thick P-type single-layer region comprises a crystal face of higher order.

The crystal face region having a crystal face different from that of the principal surface is of a three-layer structure comprising an N-type layer extending along a {311} B face and P-type layers sandwiching the N-type layer, the crystal face region extending along the principal surface is of a three-layer structure comprising an N-type layer extending along a {100} face and P-type layers sandwiching the N-type layer, and the relatively thick P-type single-layer region comprises a crystal face of higher order.

The N-type layer of the three-layer structure of the crystal face region having a crystal face different from that of the principal surface is positioned in contact with opposite sides of the active layer in the cross-sectionally triangular body.

The {311} B face region in the current blocking layer, which is joined to or positioned near the opposite ends of the active layer over the raised region, is relatively thin, and can be positionally selected with much leeway for increased reliability. The region of the crystal face of higher order in the current blocking layer is relatively thick for reliable prevention of leak currents through that region.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

In the illustrated embodiments which will be described below, the principles of the present invention are applied to semiconductor lasers of AlGaAs in the III-V group.

Embodiment 1

Figure 1:
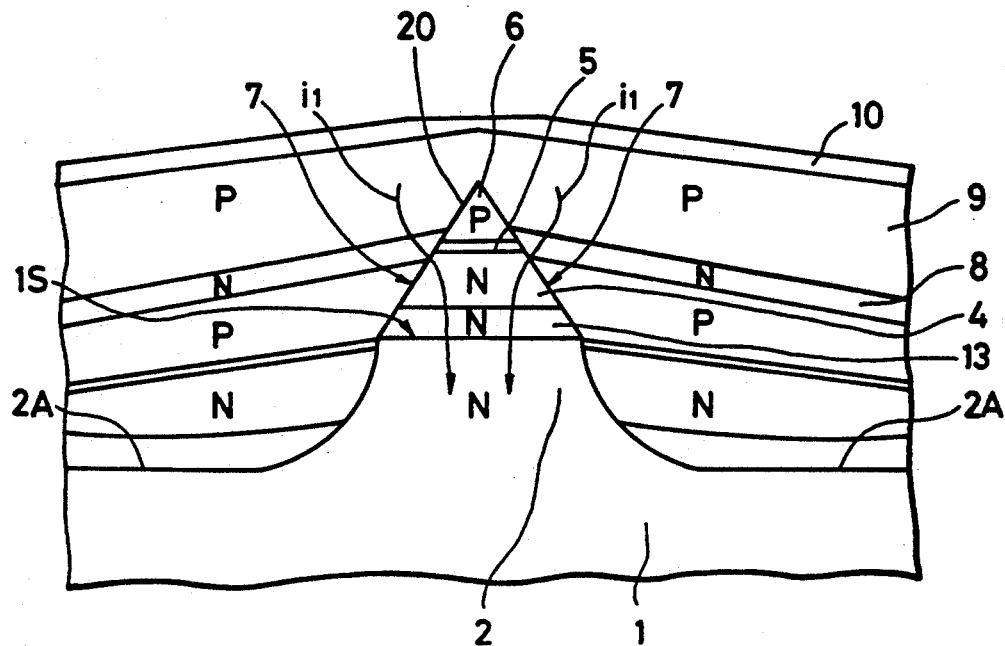
FIG. 1 is an enlarged fragmentary cross-sectional view of a conventional semiconductor laser.
Figure 2:
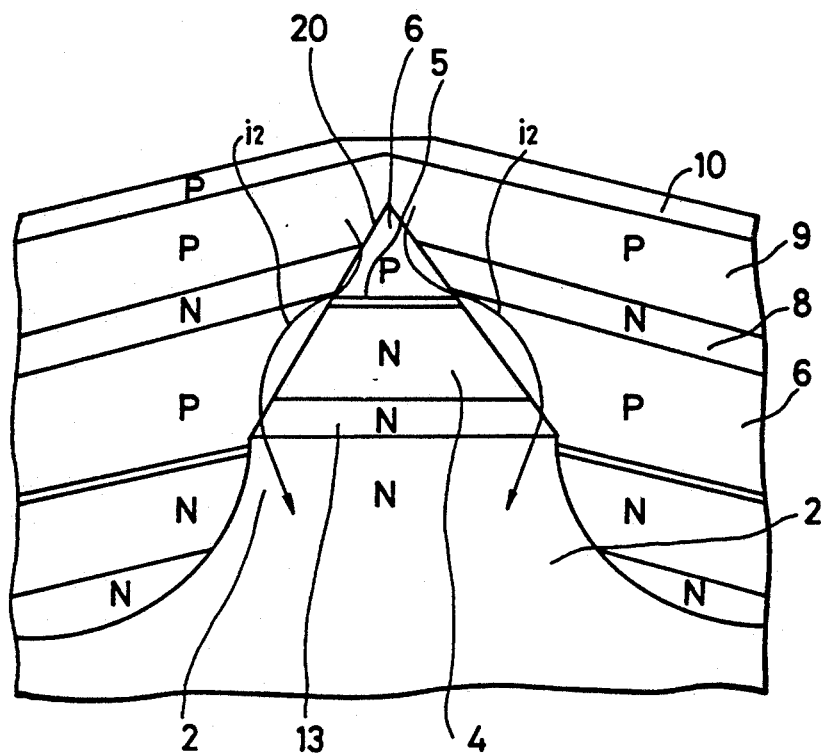
FIG. 2 is an enlarged fragmentary cross-sectional view of another conventional semiconductor laser.
Figure 3:
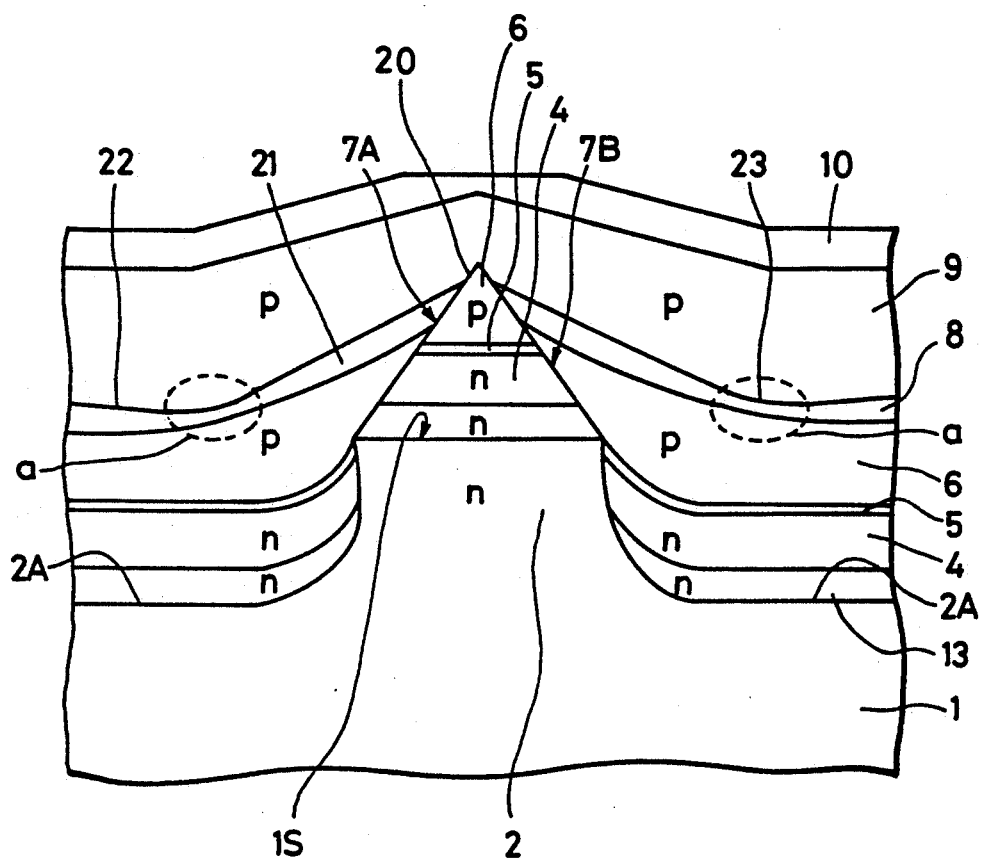
FIG. 3 is an enlarged fragmentary cross-sectional view of still another conventional semiconductor laser.
Figure 4:
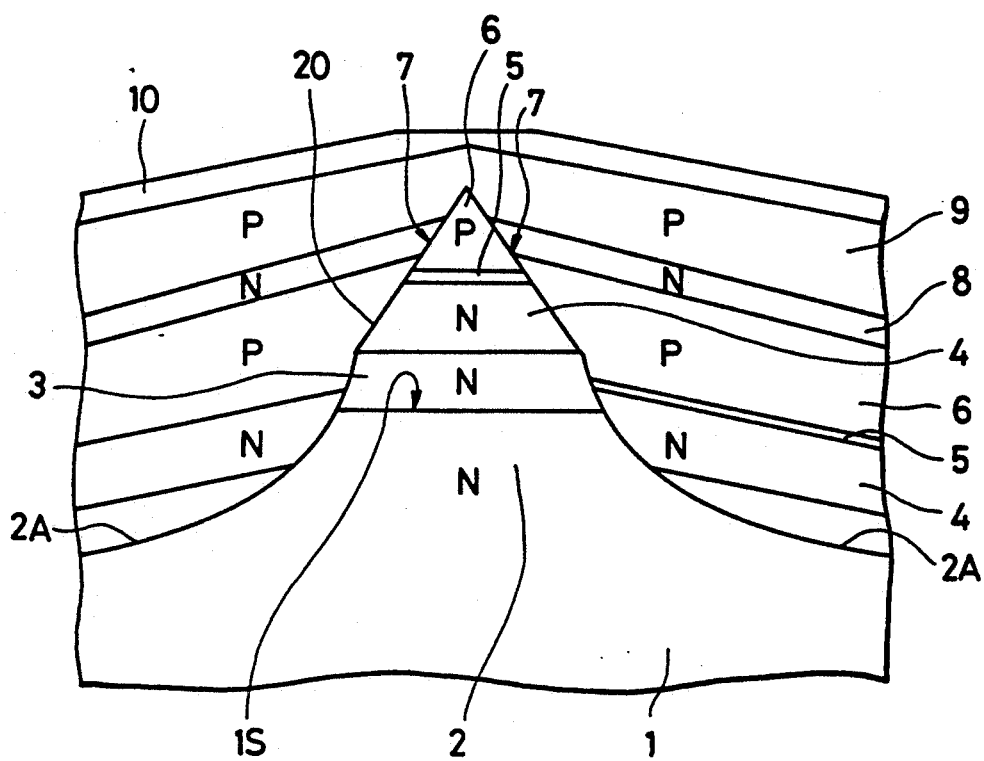
FIG. 4 is an enlarged fragmentary cross-sectional view of a semiconductor laser according to a first embodiment of the present invention.
Figure 5:
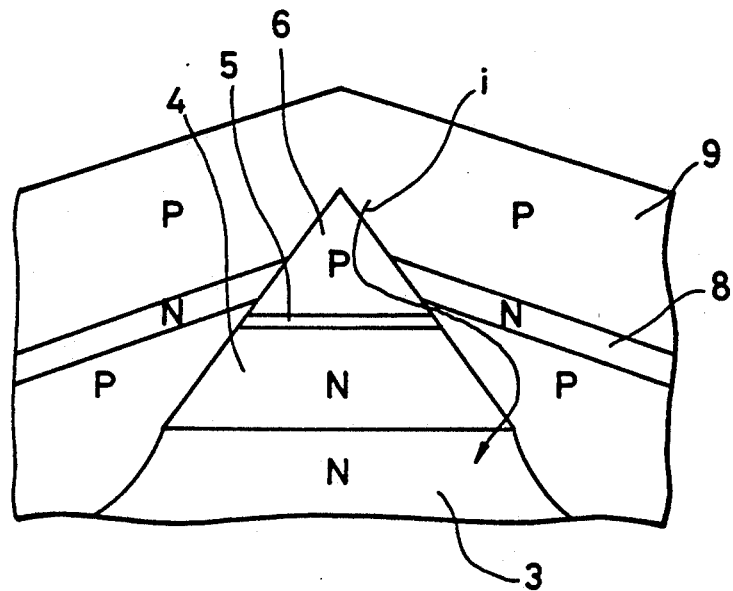
FIG. 5 is an enlarged fragmentary cross-sectional view of a central portion of the semiconductor laser shown in FIG. 4.

FIGS. 4 and 5 show a semiconductor laser according to a first embodiment of the present invention.

As shown in FIG. 4, an N-type substrate 1 made of GaAs, for example, has a principal surface 1S as the {100} plane, e.g., the (100) face. An N-type AlGaAs layer 3 of $Al_{x1}Ga_{1-x1}As$ is deposited to a thickness of 1 μm, for example, on the principal surface 1S by way of epitaxial growth. Then, a strip etching mask extending along the <011> axis, e.g., in the [011] direction, is deposited in a predetermined width on the AlGaAs layer 3 by photoresist coating and pattern exposure, for example. Using the etching mask, the substrate 1 is crystallographically etched from above the AlGaAs layer 3 to form a strip raised region or land 2 extending in the [011] direction, the raised region 2 being composed of the substrate 1 and the AlGaAs layer 3. The [011] direction extends perpendicularly to the sheet of FIG. 4.

After the etching mask is removed, a first N-type cladding layer 4 of $Al_{x2}Ga_{1-x2}As$, an active layer 5 which is undoped with or contains a low concentration of $Al_yGa_{1-y}As$ or the like, and a second P-type cladding layer 6 of $Al_{x2}Ga_{1-x2}As$ or the like are successively deposited over the entire surface formed so far, including grooves 2A one on each side of the raised region 2, by way of epitaxial growth according to the ordinary MOVCD process that employs a gas of methyl organic metal.

The layers are formed over the raised region 2 and the grooves 2A by way of epitaxial growth. Over the raised region 2, slanted surfaces 7 are produced of their own accord from the opposite sides of the raised region 2, the slanted surfaces 7 being inclined at about 55° to the (100) face and composed of the (111) B face. Since epitaxial growth is less liable to progress on the slanted surfaces 7 according to the methyl MOCVD process, the layers 4, 5, 6 over the raised region 2 and the grooves 2A are separated from each other.

The width and height of the raised region 2 and the thicknesses of the layers 4, 5, 6 are selected such that the lower surface of the second cladding layer 6 over the grooves 2A is held in contact with the opposite sides of the AlGaAs layer 3 on the raised region 2, and the opposite slant surfaces 7 over the raised region 2 intersect with each other while the second cladding layer 6 is growing. The layers 4, 5, 6 over the raised region 2 jointly constitute a cross-sectionally triangular strip body 20 that extends in the [011] direction.

The second P-type cladding layer 6 is continuously caused to grow until the upper surface thereof over the grooves 2A goes beyond the opposite surfaces of the active layer 5 over the raised region 2 which face the opposite surfaces 7, and reaches a position on the opposite surfaces of the second cladding layer 6 on the active layer 5. Thereafter, an N-type current blocking layer 8 of $Al_{x2}Ga_{1-x2}As$ or the like which has a refractive index smaller than that of the active layer 5 is deposited on the second cladding layer 6 thus formed over the grooves 2A, by way of epitaxial growth according to the MOCVD process. The thickness and impurity concentration of the current blocking layer 8 are selected such that the upper surface thereof does not cover the opposite sides of the second cladding layer 6 over the raised region 2.

Furthermore, a third P-type cladding layer 9 of $Al_{x2}Ga_{1-x2}As$ or the like, and a P-type cap layer 10 of GaAs or the like are successively deposited on the current blocking layer 8 by way of epitaxial growth. Initially, no epitaxial growth layers are developed on the slant surfaces 7 composed of the (111) B face over the raised region 2. As the epitaxial growth progresses over the grooves 2A, surfaces other than the (111) B face start being produced in a region where the slant surfaces 7 intersect with each other, and the third cladding layer 9 is deposited in fully covering relationship to the cross-sectionally triangular body 20 on the raised region 2.

Although not shown, electrodes of Al or the like are formed on the cap layer 10 and the reverse side of the substrate 1 by evaporation or sputtering. In this manner, the semiconductor laser according to the first embodiment is fabricated.

The amounts of Al in the layers 4, 5, 6, 8 are selected such that $x_2 > y$ to make the band gap of the active layer 5 smaller than those of the first and second cladding layers 4, 6 and the current blocking layer 8, i.e., to make the refractive index of the active layer 5 larger, for optical confinement. The amounts of Al in the layers 3, 4, 5, 6 are selected such that $x_1 \geq x_2 > y$ to make the built-in potential between the second cladding layer 6 and the AlGaAs layer 3 over the groove 2A, higher than that between the second cladding layer 6 and the active layer 5 over the raised region 2, thus suppressing the production of leak currents across the interfaces between the second cladding layer 6 and the AlGaAs layer 3 over the grooves 2A.

The third cladding layer 9, the current blocking layer 8, the second cladding layer 6, and the first cladding layer 4 over the grooves 2A jointly provide a P-N-P-N thyristor structure on each side of the cross-sectionally triangular body 20. As described above, the built-in potential across the interface between the AlGaAs layer 3 over the raised region 2 and the second cladding layer 6 over the grooves 2A is relatively high, and the built-in potential across the interface between the second cladding layer 6 and the active layer 5 in the body 20 is relatively low. Accordingly, a current is concentrated on the active layer 5 in the body 20, thereby reducing leaking currents over the grooves 2A for a lower threshold current.

Inasmuch as the AlGaAs layer 3 of a relatively high Al concentration is deposited on the GaAs substrate 1 by way of epitaxial growth, the crystallinity of the first cladding layer 4 and the active layer 5 that are deposited on the AlGaAs layer 3 tends to be degraded. Crystal defects or distortions of the first cladding layer 4 and the active layer 5 can be avoided by increasing the thickness of AlGaAs layer 3 to a relatively large value of about 1 μm. It has been confirmed that the sum of the thicknesses of the AlGaAs layer 3 and the first cladding layer 4 thereon may be about 1 μm for the prevention of crystal defects or distortions in the upper epitaxial growth layers.

The AlGaAs layer 3, which serves as a cladding layer whose refractive index is smaller than that of the active layer 5, is present on the raised region 2. Therefore, the thickness of the first cladding layer 4 may be smaller than heretofore, with the result that the height of the raised region 2, i.e., the depth of the grooves 2A, may be reduced. The raised region 2 can thus be etched with better controllability for increased uniformity of the configuration of the raised region 2 and hence increased uniformity of semiconductor lasers for higher reliability.

Embodiment 2

Figure 6:
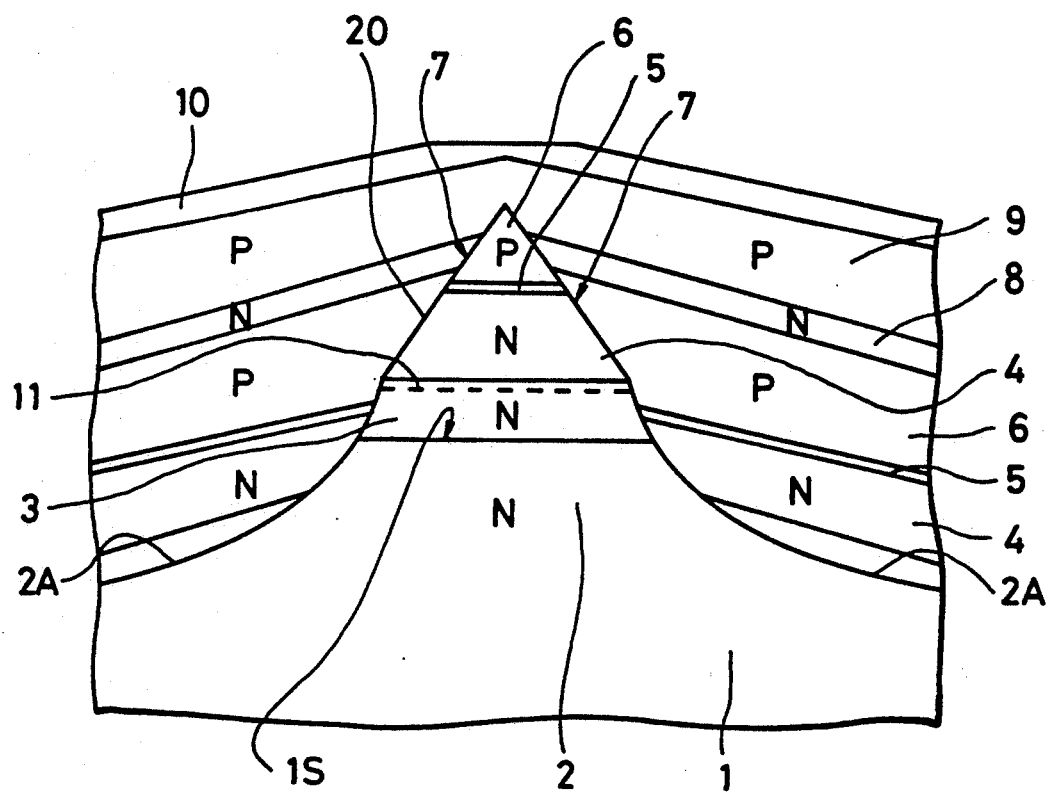
FIG. 6 is an enlarged fragmentary cross-sectional view of a semiconductor laser according to a second embodiment of the present invention.

FIG. 6 shows a semiconductor laser according to a second embodiment of the present invention. Those parts shown in FIG. 6 which correspond to those shown in FIG. 4 are denoted by identical reference characters, and will not be described in detail. A process of fabricating the semiconductor laser shown in FIG. 6 is illustrated in FIGS. 7A through 7C.

Figure 7A:
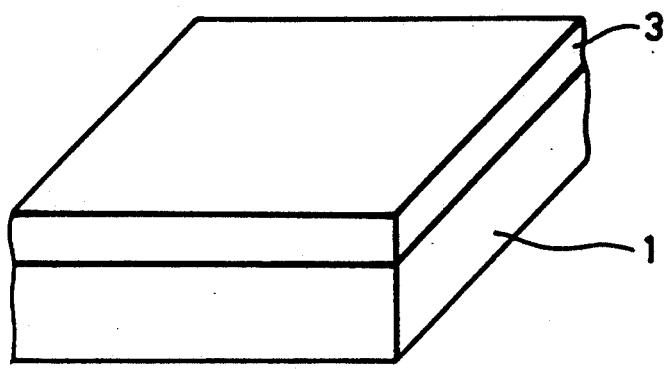
FIGS. 7A, 7B, and 7C are perspective views showing a process of fabricating the semiconductor laser shown in FIG. 6.

As shown in FIG. 7A, an AlGaAs layer 3 is first deposited on a substrate 1 of GaAs or the like by way of epitaxial growth.

Figure 7B:
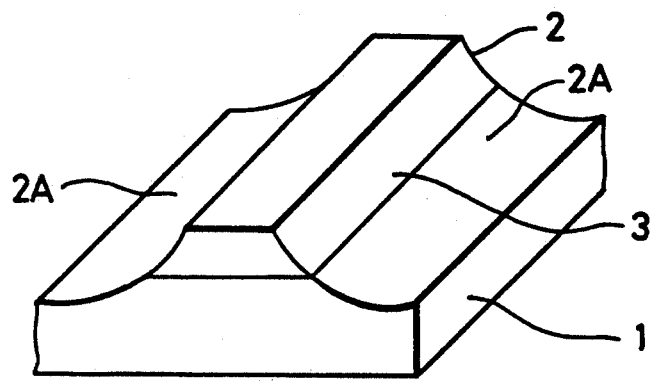

Thereafter, as shown in FIG. 7B, a raised region or land 2 extending in the [011] direction is formed on the substrate 1 by crystallographic etching. At this time, grooves 2A are also formed in the substrate 1 one on each side of the raised region 2.

Figure 7C:
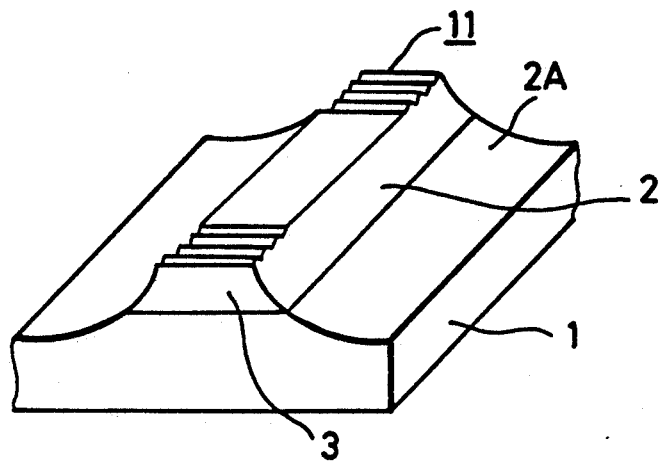

As shown in FIG. 7C, a diffraction grating 11 of a predetermined line pitch is formed on the AlGaAs layer 3 by the known two-beam interference exposure method. In the illustrated embodiment, the diffraction grating 11 is composed of a multiplicity of parallel slits extending transversely of the stripe raised region 2. Specifically, a photoresist is coated on the entire surface of the substrate 1 including the raised region 2, and then exposed to interference fringes produced by two beams. The exposed photoresist is thereafter developed, and used as an etching mask when the AlGaAs layer 3 on the raised region 2 is etched to produce parallel slits extending perpendicularly to the direction of the raised region 2 and spaced at a predetermined pitch which satisfies the Bragg conditions for reflectance to achieve single-mode oscillation.

After the diffraction grating 11 is formed, as shown in FIG. 6, layers 4, 5, 6, 8, 9 are successively deposited in the same manner as described above with respect to the first embodiment. Then, although not shown, electrodes of Al or the like are formed on a cap layer 10 and the reverse side of the substrate 1 by evaporation or sputtering, thus fabricating the semiconductor laser according to the second embodiment.

As with the first embodiment, a P-N-P-N thyristor structure is provided over the grooves 2A on each side of the cross-sectionally triangular body 20. The built-in potential across the interface between the AlGaAs layer 3 and the second cladding layer 6 over the grooves 2A is higher than the built-in potential across the interface between the second cladding layer 6 and the active layer 5 in the body 20. Accordingly, a current is concentrated on the active layer 5 in the body 20, thereby reducing leaking currents over the grooves 2A for a lower threshold current. The diffraction grating 11 is effective to enable the semiconductor laser to carry out single-wavelength oscillation.

Since the AlGaAs layer 3, which serves as a cladding layer with respect to the active layer 5, is present on the raised region 2, the depth of the grooves 2A may be reduced. The raised region 2 can thus be etched for increased uniformity of the configuration thereof for higher reliability of semiconductor lasers.

In the first and second embodiments, the substrate 1, the AlGaAs layer 3, the first cladding layer 4, and the current blocking layer 8 are of the N type, and the second and third cladding layers 6, 9 are of the P type. However, these layers may be of different conductivity types.

Embodiment 3

Figure 8:
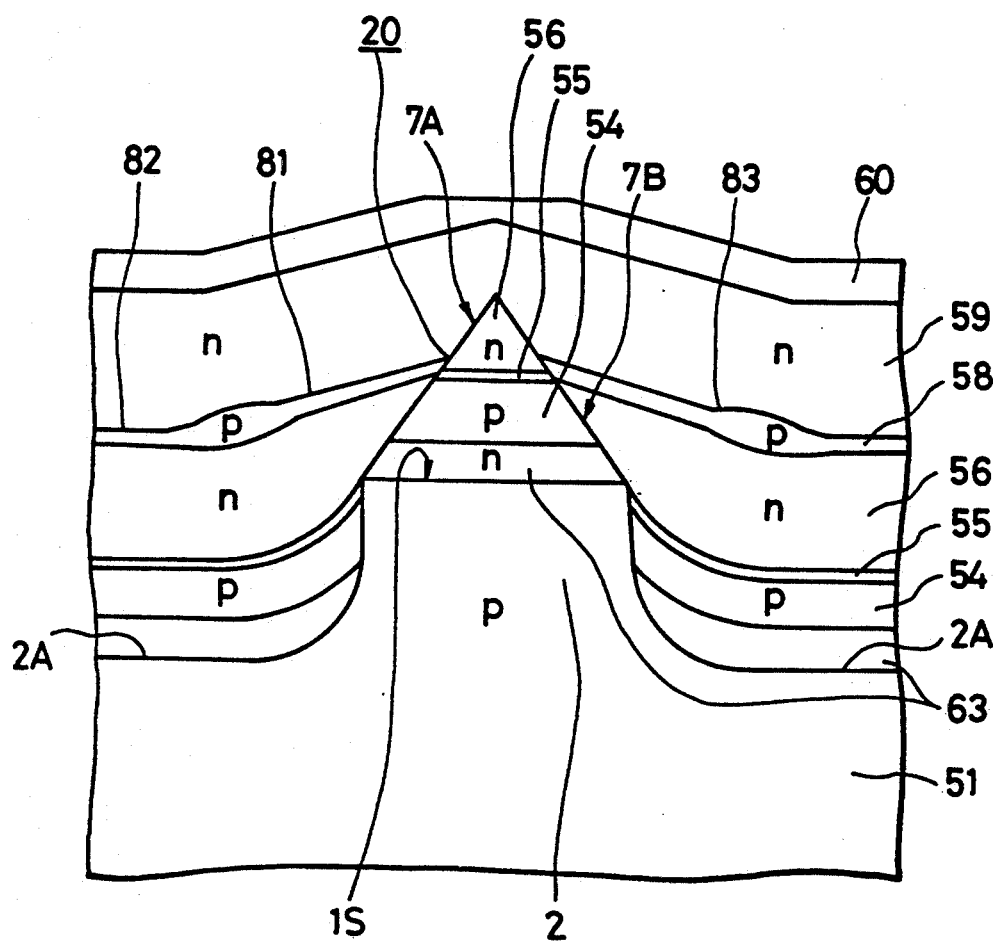
FIG. 8 is an enlarged fragmentary cross-sectional view of a semiconductor laser according to a third embodiment of the present invention.

FIG. 8 shows a semiconductor laser according to a third embodiment of the present invention.

As shown in FIG. 8, a P-type substrate 1 made of GaAs, for example, has a principal surface 1S as the {100} plane, e.g., the (100) face. A stripe etching mask extending along the <011> axis, e.g., in the [011] direction, is deposited in a predetermined width on the principal surface 1S by photoresist coating and pattern exposure, for example. Using the etching mask, the substrate 1 is crystallographically etched from above the principal surface 1S with an etching solution of $H_2SO_4$, $H_2O_2$, and $H_2O$ that are mixed at a ration of 3:1:1 to form a stripe raised region or land 2 extending in the [011] direction. The [011] direction extends perpendicularly to the sheet of FIG. 8.

After the etching mask is removed, a buffer layer 63 of GaAs or the like, a P-type cladding layer 54 of AlGaAs, an active layer 55 which is undoped with or contains a low concentration of GaAs or the like, and an N-type cladding layer 56 of AlGaAs or the like are successively deposited over the entire surface formed so far, including grooves 2A one on each side of the raised region 2, by way of epitaxial growth according to the ordinary MOVCD process that employs a gas of methyl organic metal. The layers are formed over the raised region 2 and the grooves 2A by way of epitaxial growth. Over the raised region 2, slanted surfaces 7A, 7B are produced of their own accord from the opposite sides of the raised region 2, the slanted surfaces 7A, 7B being inclined at about 55° to the (100) face and composed of the (111) B face. Since epitaxial growth is less liable to progress on the slanted surfaces 7A, 7B according to the methyl MOCVD process, the layers 53, 54, 55, 56 over the raised region 2 and the grooves 2A are separated from each other.

The width and height of the raised region 2 and the thicknesses of the layers 53, 54, 55, 56 are selected such that the opposite slant surfaces 7A, 7B intersect with each other while the second N-type cladding layer 56 is growing. The layers 53, 54, 55, 56 over the raised region 2 jointly constitute a cross-sectionally triangular stripe body 20.

The second N-type cladding layer 56 is continuously caused to grow until the upper surface thereof over the grooves 2A reaches an intermediate position on the opposite surfaces of the active layer 55 over the raised region 2 which face the slanted surfaces 7A, 7B, respectively. Thereafter, an P-type current blocking layer 58 of AlGaAs or the like which has a refractive index smaller than that of the active layer 55 is deposited on the second cladding layer 56 thus formed over the grooves 2A, by way of epitaxial growth according to the MOCVD process. The thickness and impurity concentration of the current blocking layer 58 are selected such that the upper surface thereof covers areas, below an intermediate position, of the opposite sides of the second cladding layer 56 over the raised region 2.

The regions of the current blocking layer 58 which extend and are joined to the cross-sectionally triangular body 20 on the raised region 2 comprise {311} B face regions 81 along (311) B faces. Since the {311} B face regions 81 are liable to turn into N-type regions, they are thinner than the other regions of the current blocking layer 58.

The regions of the current blocking layer 58 which are spaced from the {311} B face regions 81 comprise {111} face regions 82 along (100) B faces. The regions of the current blocking layer 58 where the {311} B face regions 81 progressively change to the {100} B face regions 82 comprise crystal face regions 83 of higher order. Since the crystal face regions 83 are liable to turn into P-type regions, they are thicker than the other regions of the current blocking layer 58.

Furthermore, a third N-type cladding layer 59 of AlGaAs or the like, and an N-type cap layer 60 of GaAs or the like are successively deposited on the current blocking layer 8 by way of epitaxial growth. Initially, no epitaxial growth layers are developed on the slant surfaces 7A, 7B composed of the (111) B face over the raised region 2. As the epitaxial growth progresses over the grooves 2A, surfaces other than the (111) B face start being produced in a region where the slant surfaces 7A, 7B intersect with each other, and the third cladding layer 59 is deposited in fully covering relationship to the cross-sectionally triangular body 20 on the raised region 2.

Although not shown, electrodes of Al or the like are formed on the cap layer 60 and the reverse side of the substrate 1 by evaporation or sputtering. In this manner, the semiconductor laser according to the third embodiment is fabricated.

The active layer 55 in the stripe body 20 on the raised region 2 is sandwiched between divided layer sections of the current blocking layer 58 and the first cladding layer 56 over the grooves 2A, i.e., confined transversely of the body 20, providing a lasing region. Because the current blocking layer 58 is present, the third cladding layer 59, the current blocking layer 58, the second cladding layer 56, and the first cladding layer 54 over the grooves 2A jointly provide an N-P-N-P thyristor structure on each side of the cross-sectionally triangular body 20 for preventing currents from flowing therethrough. Accordingly, a current is concentrated on the active layer 55 in the body 20, thereby lowering the threshold current.

In the embodiment shown in FIG. 8, the lower surface of the current blocking layer 58 which is held against the slant surfaces 7A,7B is positioned on opposite ends of the active layer 55. However, the lower surface of the current blocking layer 58 may be positioned in contact with the opposite sides of the second cladding layer 56 for practically suppressing leak currents insofar as the lower surface of the current blocking layer 58 is positioned in the vicinity of the opposite ends of the active layer 55.

The upper surface of the current blocking layer 58 is positioned below the crest of the body 20 where the slant surfaces 7A, 7B intersect with each other on the second cladding layer 56, so that the current blocking layer 58 does not fully cover the crest of the body 20. To achieve such a configuration, it is necessary to control the thickness of the second cladding layer 56 over the grooves 2A. Since the regions of the current blocking layer 58 that extend and are joined to the active layer 55 in the body 20 are relatively thin, as described above, those regions of the current blocking layer 58 can be positionally selected with much leeway. Consequently, the semiconductor laser is highly reliable and can be fabricated with an increased yield.

The crystal face regions 83 of higher order which are positioned one on each side of the active layer 55 are relatively thick to reliably prevent leak currents from being produced in the regions remote from the active layer 55. Therefore, the current in the semiconductor laser is constricted highly reliably. Stated otherwise, a P-N-P-N thyristor structure is prevented from being impaired, a problem which would be caused if an N-type current blocking layer were deposited by way of epitaxial growth.

Embodiment 4

Figure 9:
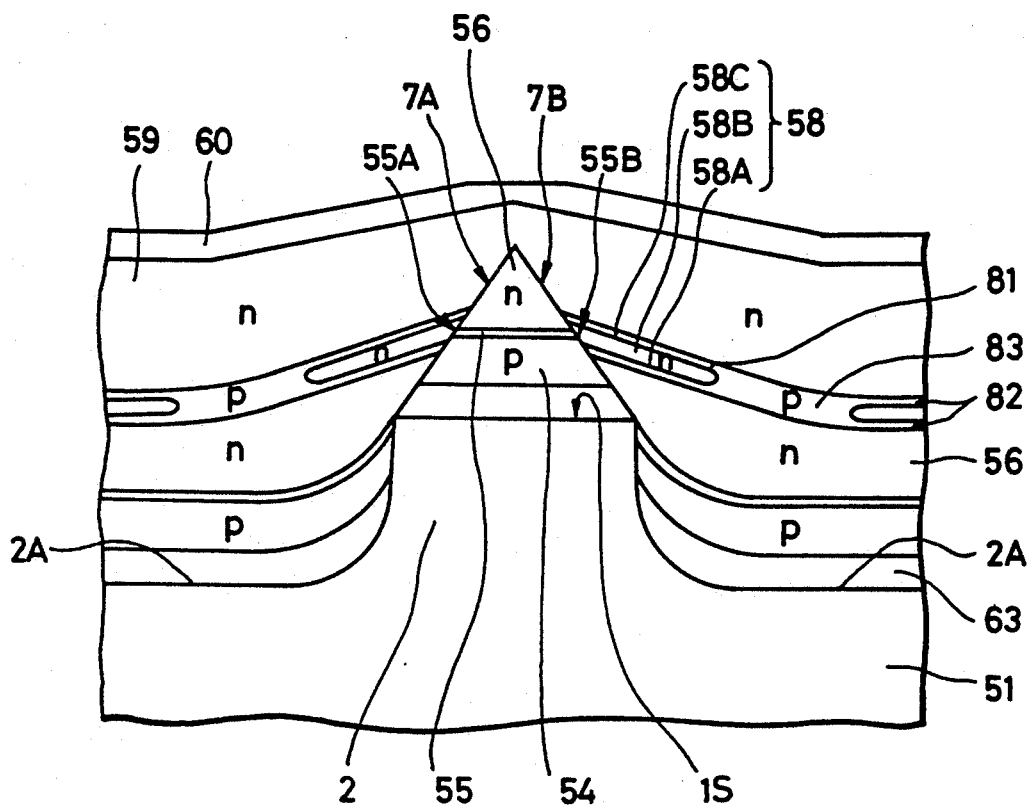
FIG. 9 is an enlarged fragmentary cross-sectional view of a semiconductor laser according to a fourth embodiment of the present invention.

FIG. 9 shows a semiconductor laser according to a fourth embodiment of the present invention. Those parts shown in FIG. 9 which correspond to those shown in FIG. 8 are denoted by identical reference characters, and will not be described in detail.

According to the fourth embodiment shown in FIG. 9, a current blocking layer 58 is of a three-layer structure. A second N-type cladding layer 56 over the grooves 2A has an upper surface held in contact with the opposite sides of a first P-type cladding layer 54, which face the opposite sides 7A, 7B, over the raised region 2. A P-type blocking layer 58A of AlGaAs or the like, an N-type blocking layer 58B of AlGaAs or the like, and a P-type blocking layer 58C of AlGaAs or the like are successively deposited on the second cladding layer 56 by way of epitaxial growth according to the methyl MOCVD, these layers 58A, 58B, 58C jointly serving as the current blocking layer 58. {311} B face regions 81 of the current blocking layer 58 which extend and are joined to, or are positioned in the vicinity of, the opposite ends of an active layer 55 in a cross-sectionally triangular body 20 are liable to turn into P-type regions. In each of the {311} B face regions 81, the P-type blocking layers 58A, 58C have a relatively small thickness, and the N-type blocking layer 58B has a relatively large thickness. Crystal face regions 83 of the current blocking layer 58 over the grooves 2A are apt to turn into N-type regions. In each of the crystal face regions 83, the N-type blocking layer 58B has a relatively small thickness, and the P-type blocking layers 58A, 58C have a relatively large thickness.

The thicknesses and impurity concentrations of the respective layers may be selected such that the blocking layer 58B is held in contact with opposite ends 55A, 55B of the active layer 55 in the body 20, and the blocking layers 58A, 58B are held in contact with the opposite sides of the first and second cladding layers 54, 56, respectively, below and above the active layer 55. In each of the crystal face regions 83, the N-type blocking layer 58B is caused to turn fully into a P-type layer which is of the same conductivity type as that of the P-type blocking layers 58A, 58C, and they jointly serve as a P-type region which is relatively thick.

On both sides of the cross-sectionally triangular body 20, the blocking layers 58C, 58B, 58A and the second cladding layer 56 jointly provide a P-N-P-N thyristor structure on each side of the cross-sectionally triangular body 20 for reducing leak currents to thereby lower the threshold current. The thyristor structure is also prevented from being impaired, a problem which would be caused if an N-type current blocking layer were deposited by epitaxial growth.

In the above embodiments, the present invention has been described with respect to semiconductor lasers of AlGaAs in the III-V group. However, the present invention is also applicable to semiconductor lasers of various materials such as InP.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. A semiconductor laser comprising:
   a strip raised region consisting of a semiconductor substrate and an AlGaAs layer on said semiconductor substrate;

first lower and second upper cladding layers disposed on said AlGaAs layer;

an active layer interposed between said first and second cladding layers;

said first and second cladding layers and said active layers being divided into sections in a cross-sectionally triangular body and sections on opposite sides of said cross-sectionally triangular two slant surfaces extending from opposite edges of said raised region and intersecting with each other above said raised region;

a current blocking layer disposed on each side of said cross-sectionally triangular body;

a third cladding layer covering said current blocking layer and said cross-sectionally triangular body; and a cap layer disposed on said third cladding layer;

the arrangement being such that a supplied current flows substantially through said active layer in said cross-sectionally triangular body, enabling said active layer to emit light.

2. A semiconductor laser comprising:

a strip raised region consisting of a semiconductor substrate and an AlGaAs layer on said semiconductor substrate:

first lower and second upper cladding layers disposed on said AlGaAs layer;

an active layer interposed between said first and second cladding layers;

said first and second cladding layers and said active layers being divided into sections in a cross-sectionally triangular body and sections on opposite sides of said cross-sectionally triangular two slant surfaces extending from opposite edges of said raised region and intersecting with each other above said raised region;

a current blocking layer disposed on each side of said cross-sectionally triangular body;

a third cladding layer covering said current blocking layer and said cross-sectionally triangular body; and a cap layer disposed on said third cladding layer;

the arrangement being such that a supplied current flows substantially through said active layer in said cross-sectionally triangular body, enabling said active layer to emit light, and further including a diffraction grating disposed on an upper surface of said AlGaAs layer.

3. A semiconductor laser according to claim 2, wherein said principal surface of the semiconductor substrate comprises a {100} face, said stripe raised region extending along a <011> axis.

4. A semiconductor laser according to claim 3, wherein said two slant surfaces comprise a {111} B face.

5. A semiconductor laser according to claim 4, wherein said semiconductor substrate is made of GaAs, and said first and second cladding layers are made of AlGaAs, said AlGaAs layer on said semiconductor substrate contains an amount of Al which is at least equal to the amount of Al contained in said first and second cladding layers.

6. A semiconductor laser according to claim 5, wherein said semiconductor substrate is of a P or N conductivity type, said current blocking layer being of the same conductivity type as that of said semiconductor substrate.

7. A semiconductor laser according to claim 6, wherein at least said first and second cladding layers and said active layer are deposited according to a metal organic chemical vapor deposition process using a gas of methyl organic metal.

8. A semiconductor laser comprising:

a P-type semiconductor substrate having a principal surface comprising as a predetermined crystal face, said semiconductor substrate having a strip raised region on said principal surface;

first lower and second upper cladding layers disposed on said semiconductor substrate;

an active layer interposed between said first and second cladding layers;

said first and second cladding layers and said active layers being divided into sections in a cross-sectionally triangular body and sections on opposite sides of said cross-sectionally triangular body, by two slant surfaces extending from opposite edges of said raised region and intersecting with each other above said raised region;

a P-type current blocking layer disposed on each side of said cross-sectionally triangular body;

said P-type current blocking layer comprising a relatively thin crystal face region near said cross-sectionally triangular body, said relatively thin crystal face region having a crystal face different from that of said principal surface, a relatively thin crystal face region extending along said principal surface, and a relatively thick region interconnecting both of said relatively thin crystal face regions;

a third cladding layer covering said current blocking layer and said cross-sectionally triangular body; and a cap layer disposed on said third cladding layer;

the arrangement being such that a supplied current flows substantially through said active layer in said cross-sectionally triangular body, enabling said active layer to emit light.

9. A semiconductor laser comprising:

a P-type semiconductor substrate having a principal surface comprising as a predetermined crystal face, said semiconductor substrate having a strip raised region on said principal surface;

first lower and second upper cladding layers disposed on said semiconductor substrate;

an active layer interposed between said first and second cladding layers;

said first and second cladding layers and said active layers being divided into sections in a cross-sectionally triangular body and sections on opposite sides of said cross-sectionally triangular body, by two slant surfaces extending from opposite edges of said raised region and intersecting with each other above said raised region;

a current blocking layer disposed on each side of said cross-sectionally triangular body;

said current blocking layer comprising a crystal face region near said cross-sectionally triangular body, said crystal face region having a crystal face different from that of said principal surface, a crystal face region extending along said principal surface and composed of a plurality of thin layers of alternately different conductivity types, and a relatively thick P-type single-layer region interconnecting both of said crystal face regions;

a third cladding layer covering said current blocking layer and said cross-sectionally triangular body; and a cap layer disposed on said third cladding layer;

the arrangement being such that a supplied current flows substantially through said active layer in said cross-sectionally triangular body, enabling said active layer to emit light.

10. A semiconductor laser according to claim 8 or 9, wherein said principal surface of the semiconductor substrate comprises a {100}face.

11. A semiconductor laser according to claim 10, wherein said crystal face region having a crystal face different from that of said principal surface comprises a {311} B face, said crystal face region extending along said principal surface comprises a {100} face, and said relatively thick P-type single-layer region comprises a crystal face of higher order.

12. A semiconductor laser according to claim 11, wherein at least said first and second cladding layers, said active layer, and said current blocking layer are deposited with a metal organic chemical vapor deposition process using a gas of methyl organic metal.

13. A semiconductor laser according to claim 9, wherein said crystal face region having a crystal face different from that of said principal surface is of a three-layer structure comprising an N-type layer extending along a {311} B face and P-type layers sandwiching said N-type layer, said crystal face region extending along said principal surface is of a three-layer structure comprising an N-type layer extending along a {100} face and P-type layers sandwiching said N-type layer, and said relatively thick P-type single-layer region comprises a crystal face of higher order.

14. A semiconductor laser according to claim 13, wherein at least said first and second cladding layers, said active layer, and said current blocking layer are deposited according to a metal organic chemical vapor deposition process using a gas of methyl organic metal.

15. A semiconductor laser according to claim 13, wherein said N-type layer of said three-layer structure of said crystal face region having a crystal face different from that of said principal surface is positioned in contact with opposite sides of said active layer in said cross-sectionally triangular body.

* * * * *

UNITED STATES PATENT AND TRADEMARK OFFICE
CERTIFICATE OF CORRECTION

PATENT NO. : 5,255,280
DATED : October 19, 1993
INVENTOR(S) : Narui et al

It is certified that error appears in the above-indentified patent and that said Letters Patent is hereby corrected as shown below:

On the title page, items [19] and [75], change the name of the inventors from "Harui et al" to read --Narui et al--.

Signed and Sealed this

Fifteenth Day of November, 1994

Attest:

BRUCE LEHMAN

Attesting Officer

Commissioner of Patents and Trademarks